(12) United States Patent
Hawrylchak et al.

(10) Patent No.: US 9,464,349 B2
(45) Date of Patent: *Oct. 11, 2016

(54) ADJUSTABLE PROCESS SPACING, CENTERING, AND IMPROVED GAS CONDUCTANCE

(71) Applicant: Applied Materials, Inc., Santa Clara, CA (US)

(72) Inventors: Lara Hawrylchak, Gilroy, CA (US); Kirankumar Savandaiah, Bangalore (IN)

(73) Assignee: APPLIED MATERIALS, INC., Santa Clara, CA (US)

( * ) Notice: Subject to any disclaimer, the term of this patent is extended or adjusted under 35 U.S.C. 154(b) by 287 days.

This patent is subject to a terminal disclaimer.

(21) Appl. No.: 14/187,585

(22) Filed: Feb. 24, 2014

(65) Prior Publication Data

US 2014/0166480 A1 Jun. 19, 2014

Related U.S. Application Data

(60) Continuation of application No. 14/042,177, filed on Sep. 30, 2013, now Pat. No. 9,096,926, which is a division of application No. 13/009,620, filed on Jan. 19, 2011, now Pat. No. 8,580,092.

(60) Provisional application No. 61/299,470, filed on Jan. 29, 2010.

(51) Int. Cl.
*C23C 16/00* (2006.01)
*C25B 9/00* (2006.01)
(Continued)

(52) U.S. Cl.
CPC ............. *C23C 14/34* (2013.01); *C23C 14/564* (2013.01); *C23C 16/4585* (2013.01); *H01J 37/32477* (2013.01); *H01J 37/32623* (2013.01);
(Continued)

(58) Field of Classification Search
CPC . C23C 14/564; C23C 16/4585; C23C 14/34; H01J 37/32477; H01J 37/32623; H01L 21/68714; H01L 21/68721; Y10T 428/12528
See application file for complete search history.

(56) References Cited

U.S. PATENT DOCUMENTS 5,437,757 A 8/1995 Rice et al.
5,518,593 A 5/1996 Hosokawa et al.
(Continued)

FOREIGN PATENT DOCUMENTS

JP 2005201327 A * 7/2005
KR 10-2006-0052443 5/2006
(Continued)

OTHER PUBLICATIONS

International Search Report and Written Opinion dated Oct. 25, 2011 for International Patent Application No. PCT/US2011/021700.
(Continued)

*Primary Examiner* — Michael Band
(74) *Attorney, Agent, or Firm* — Patterson & Sheridan, LLP

(57) ABSTRACT

Embodiments of the invention generally provide a process kit for use in a physical deposition chamber (PVD) chamber. In one embodiment, the process kit provides adjustable process spacing, centering between the cover ring and the shield, and controlled gas flow between the cover ring and the shield contributing to uniform gas distribution, which promotes greater process uniformity and repeatability along with longer chamber component service life.

19 Claims, 12 Drawing Sheets

(51) Int. Cl.
    *C23C 14/00*      (2006.01)
    *C25B 11/00*      (2006.01)
    *C25B 13/00*      (2006.01)
    *H01L 29/12*      (2006.01)
    *C23C 14/34*      (2006.01)
    *C23C 16/458*      (2006.01)
    *H01L 21/687*      (2006.01)
    *C23C 14/56*      (2006.01)
    *H01J 37/32*      (2006.01)

(52) U.S. Cl.
    CPC ... *H01L21/68714* (2013.01); *H01L 21/68721* (2013.01); *Y10T 428/12528* (2015.01)

(56) References Cited

U.S. PATENT DOCUMENTS

| | | |
|---|---|---|
| 5,632,873 A | 5/1997 | Stevens et al. |
| 5,922,133 A | 7/1999 | Tepman et al. |
| 5,953,827 A | 9/1999 | Or et al. |
| 6,126,382 A | 10/2000 | Scales et al. |
| 6,730,174 B2 | 5/2004 | Liu et al. |
| 7,296,534 B2 | 11/2007 | Fink |
| 8,580,092 B2 | 11/2013 | Hawrylchak et al. |
| 9,096,926 B2 | 8/2015 | Hawrylchak et al. |
| 2006/0090706 A1 | 5/2006 | Miller et al. |
| 2008/0178801 A1 | 7/2008 | Pavloff et al. |
| 2009/0260982 A1 | 10/2009 | Riker et al. |
| 2009/0272647 A1 | 11/2009 | Young et al. |
| 2011/0036709 A1 | 2/2011 | Hawrylchak et al. |

FOREIGN PATENT DOCUMENTS

| | | | |
|---|---|---|---|
| KR | 20070003172 A | * | 1/2007 |
| KR | 10-2007-0046765 | | 5/2007 |

OTHER PUBLICATIONS

Korean Office Action dated Dec. 28, 2015 for Application No. KR 20-2012-7000047.

Office Action and Search Report for Taiwan Application No. 100103119 dated Jul. 9, 2015.

Korean Office Action dated Jun. 30, 2016 for Application No. 20-2012-7000047.

* cited by examiner

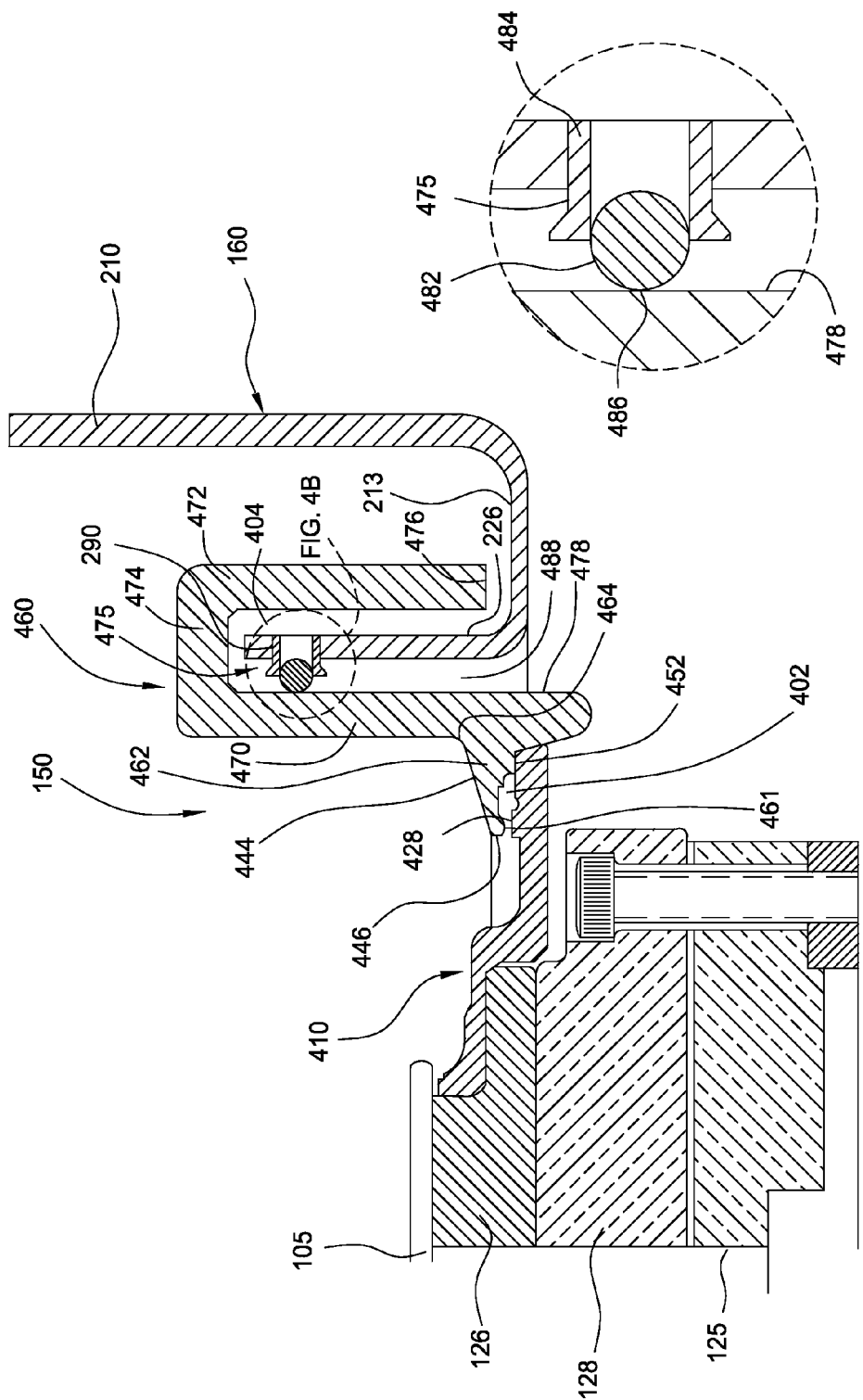

ADJUSTABLE PROCESS SPACING, CENTERING, AND IMPROVED GAS CONDUCTANCE

RELATED APPLICATIONS

This application is a continuation of U.S. patent application Ser. No. 14/042,177, filed Sep. 30, 2013, which is a divisional of U.S. patent application Ser. No. 13/009,620, filed Jan. 19, 2011, issued as U.S. Pat. No. 8,580,092, which claims benefit of U.S. Provisional Patent Application Ser. No. 61/299,470, filed Jan. 29, 2010, all of which are hereby incorporated by reference.

BACKGROUND OF THE INVENTION

1. Field of the Invention

Embodiments of the invention generally relate to a process kit for a semiconductor processing chamber, and a semiconductor processing chamber having a kit. More specifically, embodiments of the invention relate to a process kit including a cover ring, a shield, and isolator for use in a physical deposition chamber.

2. Description of the Related Art

Physical vapor deposition (PVD), or sputtering, is one of the most commonly used processes in the fabrication of electronic devices. PVD is a plasma process performed in a vacuum chamber where a negatively biased target is exposed to a plasma of an inert gas having relatively heavy atoms (e.g., argon (Ar)) or a gas mixture comprising such inert gas. Bombardment of the target by ions of the inert gas results in ejection of atoms of the target material. The ejected atoms accumulate as a deposited film on a substrate placed on a substrate support pedestal disposed within the chamber.

A process kit may be disposed in the chamber to help define a processing region in a desired region within the chamber with respect to the substrate. The process kit typically includes a cover ring, a deposition ring, and a ground shield. Confining the plasma and the ejected atoms to the processing region helps maintain other components in the chamber free from deposited materials and promotes more efficient use of target materials, as a higher percentage of the ejected atoms are deposited on the substrate.

Although conventional ring and shield designs have a robust processing history, the reduction in critical dimensions brings increasing attention to contamination sources within the chamber. As the rings and shield periodically contact each other as the substrate support pedestal raises and lowers between transfer and process positions, conventional designs are potential source of particulate contamination.

Moreover, the ability to control gas distribution within the chamber contributes to both the quality and uniformity of deposited films. Cover rings are typically centered relative to the pedestal leading to non-uniform gaps created between the cover ring and the shield leading to non-uniform gas distribution. Further, cover rings typically do not allow for variation in the distance between the target and the substrate. Also in previous designs, the surface of the substrate is at or near the top of the cover ring, which causes reactive species to concentrate near the edges of the substrate.

Therefore, there is a need in the art for an improved process kit.

SUMMARY OF THE INVENTION

Embodiments of the invention generally provide a process kit for use in a physical vapor deposition (PVD) chamber and a PVD chamber having an interleaving process kit. In one embodiment, the process kit includes an interleaving ground shield, cover ring, and isolator ring.

In one embodiment, a shield for a physical vapor deposition chamber is provided. The shield comprises a cylindrical outer band, a cylindrical inner band, a base plate coupling the inner and outer bands for forming a single piece unitary member, and a plurality of balls coupled to the cylindrical inner band. The balls extend radially inward of the cylindrical inner band.

In another embodiment, a shield for encircling a sputtering surface of a sputtering target that faces a substrate support in a substrate processing chamber is provided. The shield comprises a cylindrical outer band having a first diameter sized to encircle the sputtering surface of the sputtering target, the cylindrical outer band having a top end sized to surround the sputtering surface and a bottom end sized to surround the substrate support, a sloped step having a second diameter greater than the first diameter that extends radially outward from the top end of the cylindrical outer band, a mounting flange extending radially outward from the sloped step, a base plate extending radially inward from the bottom end of the cylindrical band, and a cylindrical inner band coupled with the base plate and sized to encircle a peripheral edge of the substrate support, wherein the cylindrical inner band has a plurality of holes each for containing a centering mechanism to maintain a controlled gap between the shield and a cover ring evenly around a diameter of the shield.

In yet another embodiment, a process kit containing a shield for encircling a sputtering surface of a sputtering target that faces a substrate support in a substrate processing chamber, a cover ring for placement about a deposition ring in the substrate processing chamber, the deposition ring is between a substrate support and the shield in the chamber, and a centering mechanism for centering the shield relative to the cover ring is provided. The shield comprises a cylindrical outer band having a first diameter sized to encircle a sputtering surface of a sputtering target, a mounting flange, a sloped step, a base plate extending radially inward from a bottom end of the cylindrical band; and a cylindrical inner band coupled with the base plate and sized to encircle a peripheral edge of a substrate support. The cylindrical outer band has a top end sized to surround the sputtering surface and the bottom end is sized to surround the substrate support. The sloped step has a second diameter greater than the first diameter that extends radially outward from the top end of the cylindrical outer band. The mounting flange extends radially outward from the sloped step. The cylindrical inner band has a plurality of holes each for containing a centering mechanism to maintain a controlled gap between the shield and a cover ring evenly around a diameter of the shield. The cover ring comprises an annular wedge, an inner cylindrical band, a bridge, and an outer cylindrical band. The annular wedge comprises an inclined top surface that encircles the substrate support, the inclined top surface having an inner periphery and an outer periphery, a footing extending downward from the inclined top surface, and a projecting brim about the inner periphery of the top surface. The inner cylindrical band extends upward and downward from the annular wedge. The bridge is coupled to an upper end of the inner cylindrical band. The outer cylindrical band extends downward from the bridge, and the outer cylindrical band has a height smaller than a height of the inner cylindrical band.

In yet another embodiment, a cover ring is provided. The cover ring comprises an annular wedge, an inner cylindrical band, a bridge, and an outer cylindrical band. The annular wedge comprises an inclined top surface that encircles the substrate support, the inclined top surface having an inner periphery and an outer periphery, a footing extending downward from the inclined top surface, and a projecting brim about the inner periphery of the top surface. The inner cylindrical band extends upward and downward from the annular wedge. The bridge is coupled to an upper end of the inner cylindrical band. The outer cylindrical band extends downward from the bridge, and the outer cylindrical band has a height smaller than a height of the inner cylindrical band.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 4A is a partial sectional view of an alternative embodiment of a process kit interfaced with the processing system of FIG. 1;

FIG. 4B is a partial sectional view of the process kit of FIG. 4A;

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Embodiments of the invention generally provide a process kit for use in a physical vapor deposition chamber (PVD) chamber. In one embodiment, the process kit provides adjustable process spacing, centering between the cover ring and the shield, and controlled gas flow between the cover ring and the shield contributing to uniform gas distribution, which promotes greater process uniformity and repeatability along with longer chamber component service life.

In one embodiment, the inner diameter wall of the shield is tall and the inner and outer diameter walls of the cover ring are tall to allow for a large spacing range through translation of the cover ring relative to the shield. The increased trench depth of the cover ring allows for a wider range of motion while still maintaining overlap to prevent plasma from leaking into the processing region. In one embodiment, the shield has evenly spaced holes for centering mechanisms to maintain an even gap between the shield and the cover ring around the diameter. In certain embodiments, the centering mechanisms may be pressed into the shield. In one embodiment, the centering mechanisms are made of precisely controlled sapphire balls pressed into metal holders which provide for minimum contact or "point contact" and allow for control of the gap between the cover ring and the shield around the diameter. This controlled gap allows for even gas conductance around the substrate, leading to an even gas distribution around the substrate. In one embodiment, the substrate surface is far below the top of the cover ring thus moving the gas entry above the substrate surface and improving the reactive gas distribution across the substrate surface. In certain embodiments, the cover ring texture and shape can be adjusted to account for films deposited thereon.

Figure 1:
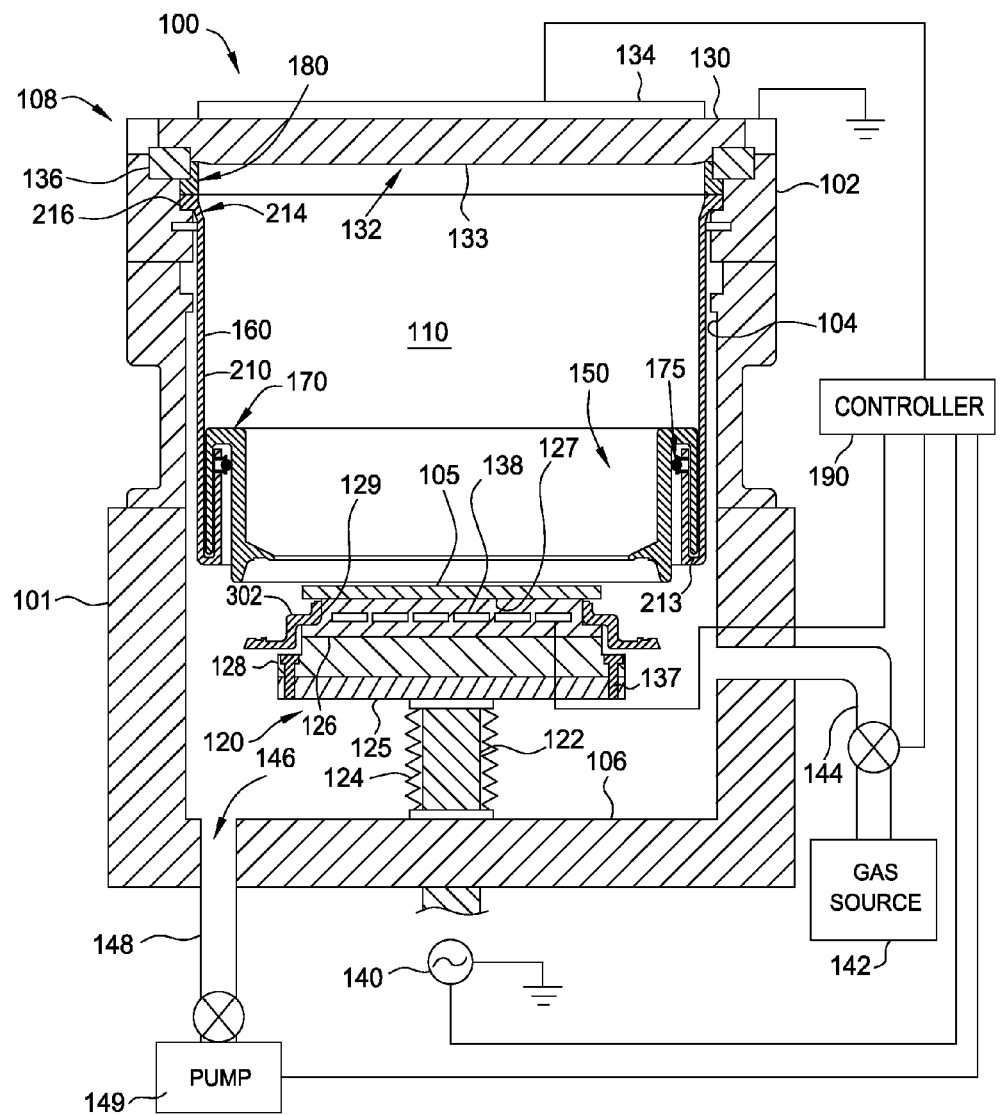
FIG. 1 is a simplified sectional view of a semiconductor processing system having one embodiment of a process kit.

FIG. 1 depicts an exemplary semiconductor processing chamber 100 having one embodiment of a process kit 150 capable of processing a substrate 105. The process kit 150 includes a one-piece ground shield 160, an interleaving cover ring 170, and a centering mechanism 175 for providing a controlled gap between the one-piece ground shield 160 and the interleaving cover ring 170. The process kit 150 may also include a deposition ring 302 supported on a pedestal assembly. In the version shown, the processing chamber 100 comprises a sputtering chamber, also called a physical vapor deposition or PVD chamber, capable of depositing titanium or aluminum oxides or nitrides on a substrate. The processing chamber 100 may also be used for other purposes, such as for example, to deposit aluminum, copper, tantalum, tantalum nitride, tantalum carbide, tungsten, tungsten nitride, lanthanum, lanthanum oxides, and titanium. One example of a processing chamber that may be adapted to benefit from the invention is the ALPS® Plus and SIP ENCORE® PVD processing chamber, available from Applied Materials, Inc. of Santa Clara, Calif. It is contemplated that other processing chambers including those from other manufacturers may be adapted to benefit from the invention.

The processing chamber 100 includes a chamber body 101 having upper adapters 102 and sidewall adapters 104, a chamber bottom 106, and a lid assembly 108 that enclose an interior volume 110 or plasma zone. The chamber body 101 is typically fabricated by machining and welding plates of stainless steel or by machining a single mass of aluminum. In one embodiment, the sidewall adapters 104 comprise aluminum and the chamber bottom 106 comprises stainless steel. The chamber bottom 106 generally contains a slit valve (not shown) to provide for entry and egress of a substrate 105 from the processing chamber 100. The lid assembly 108 of the processing chamber 100 in cooperation with the ground shield 160 that interleaves with the cover ring 170 confines a plasma formed in the interior volume 110 to the region above the substrate.

The pedestal assembly 120 is supported from the chamber bottom 106 of the chamber 100. The pedestal assembly 120 supports the deposition ring 302 along with the substrate 105 during processing. The pedestal assembly 120 is coupled to the chamber bottom 106 of the chamber 100 by a lift mechanism 122 that is configured to move the pedestal assembly 120 between an upper and lower position. Additionally, in the lower position, lift pins (not shown) are moved through the pedestal assembly 120 to space the substrate from the pedestal assembly 120 to facilitate exchange of the substrate with a wafer transfer mechanism disposed exterior to the processing chamber 100, such as a single blade robot (not shown). A bellows 124 is typically disposed between the pedestal assembly 120 and the chamber bottom 106 to isolate the interior volume 110 of the chamber body 101 from the interior of the pedestal assembly 120 and the exterior of the chamber.

The pedestal assembly 120 generally includes a substrate support 126 sealingly coupled to a base plate 128 which is coupled to a ground plate 125. The substrate support 126 may be comprised of aluminum or ceramic. The substrate support 126 may be an electrostatic chuck, a ceramic body, a heater or a combination thereof. In one embodiment, the substrate support 126 is an electrostatic chuck that includes a dielectric body having electrodes 138 embedded therein. The dielectric body is typically fabricated from a high thermal conductivity dielectric material such as pyrolytic boron nitride, aluminum nitride, silicon nitride, alumina or an equivalent material. In one embodiment, the substrate support 126 is attached to the base plate 128 by a metal foil, such as an aluminum foil, which diffusion bonds the base plate 128 and the substrate support 126.

The base plate 128 may comprise a material having thermal properties that are suitably matched to the overlying substrate support 126. For example, the base plate 128 can comprise a composite of ceramic and metal, such as aluminum silicon carbide, which provides better strength and durability than ceramic alone and also has good heat transfer properties. The composite material has a thermal expansion coefficient that is matched to the material of the substrate support 126 to reduce thermal expansion mismatch. In one version, the composite material comprises a ceramic having pores that are infiltrated with a metal, which at least partially fills the pores to form a composite material. The ceramic may comprise, for example, at least one of silicon carbide, aluminum nitride, aluminum oxide or cordierite. The ceramic may comprise a pore volume of from about 20 to about 80 volume % of the total volume, the remainder volume being of the infiltrated metal. The infiltrated metal can comprise aluminum with added silicon and may also contain copper. In another version, the composite may comprise a different composition of a ceramic and metal, such as metal having dispersed ceramic particles; or the base plate 128 can be made from only a metal, such as stainless steel or aluminum. A cooling plate (not shown) is generally disposed within the base plate 128 to thermally regulate the substrate support 126, but may also be disposed within the ground plate 125.

The ground plate 125 is typically fabricated from a metallic material such as stainless steel or aluminum. The base plate 128 may be coupled to the ground plate by a plurality of connectors 137. The connectors 137 may be one of a bolt, screw, key, or any other type of connector. The base plate 128 may be removable from the ground plate 125 for facilitating easier replacement and maintenance of the substrate support 126 and base plate 128.

The substrate support 126 has a substrate receiving surface 127 that receives and supports the substrate 105 during processing, the surface 127 having a plane substantially parallel to a sputtering surface 133 of the target 132. The substrate support 126 also has a peripheral edge 129 that terminates before an overhanging edge of the substrate 105.

The lid assembly 108 generally includes a target backing plate 130, a target 132, and a magnetron 134. The target backing plate 130 is supported by the upper adapters 102 when in a closed position, as shown in FIG. 1. A ceramic ring seal 136 is disposed between the target backing plate 130 and upper adapters 102 to prevent vacuum leakage therebetween.

The target 132 is coupled to the target backing plate 130 and exposed to the interior volume 110 of the processing chamber 100. The target 132 provides material which is deposited on the substrate during a PVD process. An isolator ring 180 is disposed between the target 132, target backing plate 130, and chamber body 101 to electrically isolate the target 132 from the target backing plate 130 and the upper adapter 102 of the chamber body 101.

The target 132 is biased with RF and/or DC power relative to ground, e.g. the chamber body 101, by a power source 140. A gas, such as argon, is supplied to the interior volume 110 from a gas source 142 via conduits 144. The gas source 142 may comprise a non-reactive gas such as argon or xenon, which is capable of energetically impinging upon and sputtering material from the target 132. The gas source 142 may also include a reactive gas, such as one or more of an oxygen-containing gas, a nitrogen-containing gas, a methane-containing gas, that are capable of reacting with the sputtering material to form a layer on a substrate. Spent process gas and byproducts are exhausted from the chamber 100 through exhaust ports 146 that receive spent process gas and direct the spent process gas to an exhaust conduit 148 having a throttle valve to control the pressure of the gas in the chamber 100. The exhaust conduit 148 is connected to one or more exhaust pumps 149. Typically, the pressure of the sputtering gas in the chamber 100 is set to sub-atmospheric levels, such as a vacuum environment, for example, gas pressures of 0.6 mTorr to 400 mTorr. A plasma is formed from the gas between the substrate 105 and the target 132. Ions within the plasma are accelerated toward the target 132 and cause material to become dislodged from the target 132. The dislodged target material is deposited on the substrate.

The magnetron 134 is coupled to the target backing plate 130 on the exterior of the processing chamber 100. One magnetron which may be utilized is described in U.S. Pat. No. 5,953,827, issued Sep. 21, 1999 to Or et al., which is hereby incorporated by reference in its entirety.

Processes performed in the chamber 100 are controlled by a controller 190 that comprises program code having instruction sets to operate components of the chamber 100 to facilitate processing of substrates in the chamber 100. For example, the controller 190 can comprise program code that includes a substrate positioning instruction set to operate the pedestal assembly 120; a gas flow control instruction set to operate gas flow control valves to set a flow of sputtering gas to the chamber 100; a gas pressure control instruction set to operate a throttle valve to maintain a pressure in the chamber 100; a temperature control instruction set to control a temperature control system (not shown) in the pedestal assembly 120 or sidewall adapter 104 to set temperatures of the substrate or sidewall adapters 104, respectively; and a process monitoring instruction set to monitor the process in the chamber 100.

The process kit 150 comprises various components that can be easily removed from the chamber 100, for example, to clean sputtering deposits off the component surfaces, replace or repair eroded components, or to adapt the chamber 100 for other processes. In one embodiment, the process kit 150 comprises a ground shield 160, an interleaving cover ring 170, and a centering mechanism 175 for providing a controlled gap between the one-piece ground shield 160 and the interleaving cover ring 170.

The shield 160 is supported by the chamber body 101 and encircles the sputtering surface 133 of a sputtering target 132 that faces the substrate support 126. The shield 160 also surrounds the peripheral edge 129 of the substrate support 126. The shield 160 covers and shadows the sidewall adapters 104 of the chamber 100 to reduce deposition of sputtering deposits originating from the sputtering surface 133 of the sputtering target 132 onto the components and surfaces behind the shield 160. For example, the shield 160 can protect the surfaces of the substrate support 126, the overhanging edge of the substrate 105, sidewall adapters 104 and chamber bottom 106 of the chamber 100.

As shown in FIGS. 1, 5A, 5B, 5C, and 5D, the shield 160 is of unitary construction and comprises a cylindrical outer band 210 having a diameter dimensioned to encircle the sputtering surface 133 of the sputtering target 132 and the substrate support 126. In one embodiment, the cylindrical outer band 210 has an inner diameter represented by arrows "A". In one embodiment, the inner diameter "A" of the cylindrical outer band 210 is between about 16 inches (40.6 cm) and about 18 inches (45.7 cm). In another embodiment, the inner diameter "A" of the cylindrical outer band 210 is between about 16.8 inches (42.7 cm) and about 17 inches (43.2 cm). In one embodiment, the cylindrical outer band 210 has an outer diameter represented by arrows "B". In one embodiment, the outer diameter "B" of the cylindrical outer band 210 is between about 17 inches (43.2 cm) and about 19 inches (48.3 cm). In another embodiment, the outer diameter "B" of the cylindrical outer band 210 is between about 17.1 inches (43.4 cm) and about 17.3 inches (43.9 cm).

An upper portion of the cylindrical outer band 210 surrounds the sputtering surface 133 of the sputtering target 132 and a bottom portion of the cylindrical outer band 210 surrounds the substrate support 126. A sloped step 214 extends radially outward from the upper portion of the cylindrical outer band 210. In one embodiment, the sloped step 214 forms an angle "α" relative to vertical. In one embodiment, the angle "α" is from between about 15 degrees to about 25 degrees from vertical. In another embodiment, the sloped angle "α" is about 20 degrees.

In one embodiment, the shield 160 has a height "C" between about 5 inches (12.7 cm) and about 7 inches (17.8 cm). In another embodiment, the shield 160 has a height "C" between about 5.5 inches (14 cm) and 6.5 inches (16.5 cm).

A mounting flange 216 extends radially outward from the sloped step 214 of the cylindrical outer band 210. The mounting flange 216 comprises a lower contact surface 218 to rest upon the upper adapter 102 of the chamber 100 and an upper contact surface 219. In one embodiment, the mounting flange 216 comprises a plurality of counterbores (not shown) shaped and sized to receive a screw to affix the shield 160 to the upper adapter 102.

In one embodiment, the upper adapter 102 supports the shield 160 and can serve as a heat exchanger about the sidewall adapter 104 of the substrate processing chamber 100. The upper adapter 102 and the shield 160 form an assembly that allows improved heat transfer from the shield 160 and which reduces thermal expansion stresses on the material deposited on the shield. Portions of the shield 160 can become excessively heated by exposure to the plasma formed in the substrate processing chamber 100, resulting in thermal expansion of the shield and causing sputtering deposits formed on the shield to flake off from the shield and fall upon and contaminate the substrate 105. The upper adapter 102 has a resting surface 222 that contacts the lower contact surface 218 of the shield 160 to allow good electrical and thermal conductivity between the shield 160 and the upper adapter 102. In one embodiment, the upper adapter 102 further comprises conduits for flowing a heat transfer fluid therethrough to control the temperature of the upper adapter 102.

Referring to FIGS. 1, 4A, 4C, 5A, 5B, 5C, and 5D, the shield 160 also comprises a base plate 213 that extends radially inward from the cylindrical outer band 210. A cylindrical inner band 226 is coupled with the base plate 213 and at least partially surrounding the peripheral edge 129 of the substrate support 126. In one embodiment, the cylindrical inner band 226 has a diameter represented by arrows "D". In one embodiment, the cylindrical inner band 226 has a diameter "D" between about 14 inches (35.6 cm) and about 16 inches (40.6 cm). In another embodiment, the cylindrical inner band 226 has a diameter "D" between about 14.5 inches (36.8 cm) and about 15 inches (38.1 cm). The cylindrical inner band 226 extends upward from and is perpendicular to the base plate 213. The cylindrical inner band 226, the base plate 213, and the cylindrical outer band 210 form a U-shaped channel. The cylindrical inner band 226 comprises a height that is less than the height of the cylindrical outer band 210. In one embodiment, the height of the cylindrical inner band 226 is about one third of the height of the cylindrical outer band 210. In one embodiment, the cylindrical inner band 226 has a height represented by arrows "E". In one embodiment, the height "E" of the cylindrical inner band 226 is from about 1.5 inches (3.8 cm) to about 4 inches (10.2 cm). In another embodiment, the height "E" of the cylindrical inner band 226 is from about 2 inches (5.1 cm) to about 3 inches (7.6 cm). In another embodiment, the height of the cylindrical inner band 226 is from about 2.4 inches (6.1 cm) to about 2.5 inches (6.4 cm).

In one embodiment, the cylindrical inner band 226 of the shield 160 has a plurality of holes 290 each for holding an individual centering mechanism 475. In one embodiment, each of the plurality of holes 290 is positioned at a uniform distance from each of the other plurality of holes 290. In one embodiment, each of the plurality of holes 290 is positioned at a uniform distance from the top of the cylindrical inner band 226. In one embodiment, there are six holes 290 evenly distributed around the diameter of the shield 160.

The cylindrical outer band 210, the sloped step 214, the mounting flange 216, the base plate 213, and the cylindrical inner band 226 comprise a unitary structure. For example, in one embodiment, the entire shield 160 can be made from aluminum or in another embodiment, 300 series stainless steel. A unitary shield 160 is advantageous over prior shields which included multiple components, often two or three separate pieces to make up the complete shield. In comparison with existing multiple part shields, which provide an extended RF return path contributing to RF harmonics causing stray plasma outside the process cavity, the unitary shield reduces the RF return path thus providing improved plasma containment in the interior processing region. A shield with multiple components makes it more difficult and laborious to remove the shield for cleaning. The single piece shield 160 has a continuous surface exposed to the sputtering deposits without interfaces or corners that are more difficult to clean out. The single piece shield 160 also more effectively shields the chamber body 101 from sputter deposition during process cycles. In one embodiment, conductance features, such as conductance holes, are eliminated. The elimination of conductance features reduces the formation of stray plasmas outside of the interior volume 110.

In one embodiment, the exposed surfaces of the shield 160 are treated with CLEANCOAT™ protective coating, which is commercially available from Applied Materials, Santa Clara, Calif. CLEANCOAT™ protective coating is a twin-wire aluminum arc spray coating that is applied to substrate processing chamber components, such as the shield 160, to reduce particle shedding of deposits on the shield 160 and thus prevent contamination of a substrate 105 in the chamber 100. In one embodiment, the twin-wire aluminum arc spray coating on the shield 160 has a surface roughness of from about 600 to about 2300 microinches.

The shield 160 has exposed surfaces facing the interior volume 110 in the chamber 100. In one embodiment, the exposed surfaces are bead blasted to have a surface roughness of 175±75 microinches. The texturized bead blasted surfaces serve to reduce particle shedding and prevent contamination within the chamber 100. The surface roughness average is the mean of the absolute values of the displacements from the mean line of the peaks and valleys of the roughness features along the exposed surface. The roughness average, skewness, or other properties may be determined by a profilometer that passes a needle over the exposed surface and generates a trace of the fluctuations of the height of the asperities on the surface, or by a scanning electron microscope that uses an electron beam reflected from the surface to generate an image of the surface.

Figure 3:
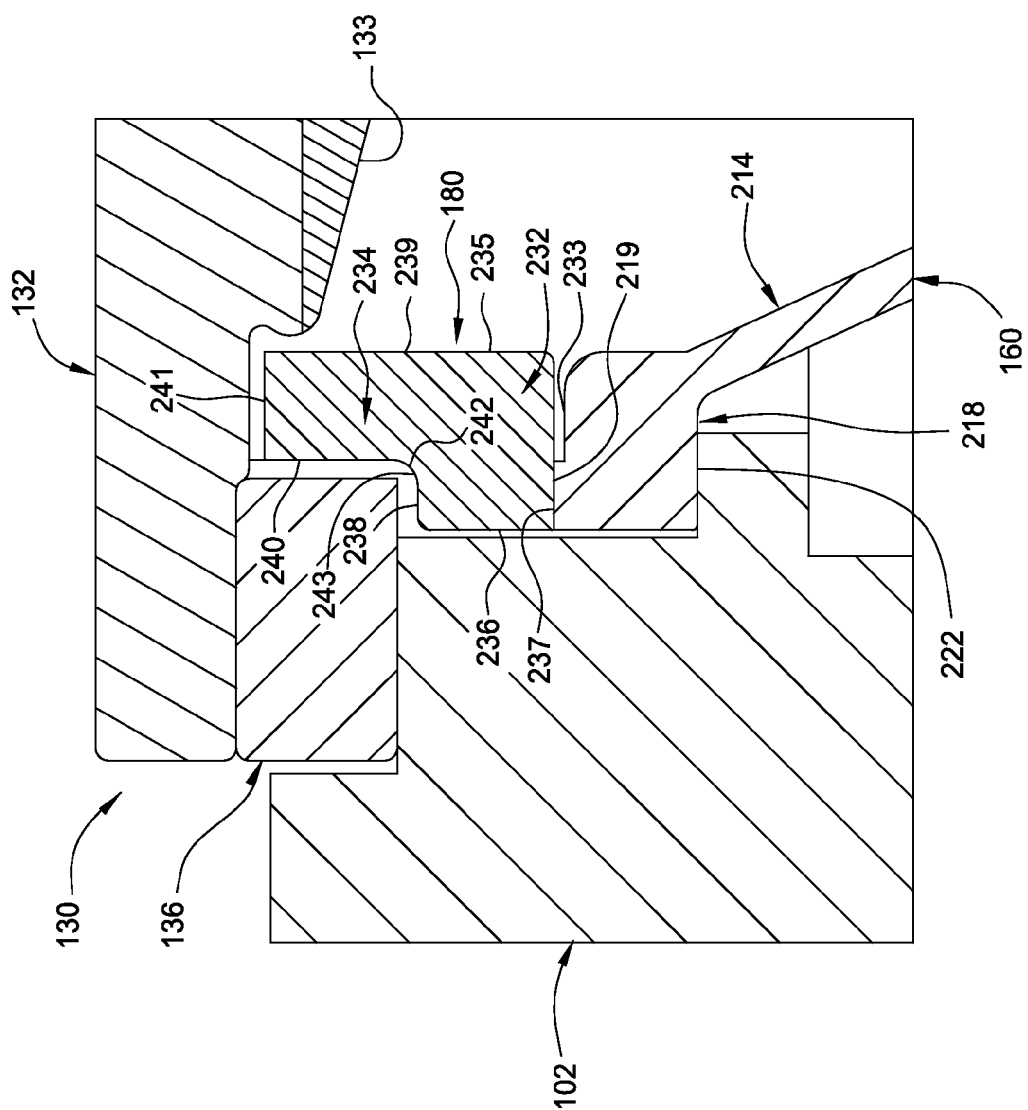
FIG. 3 is a partial sectional view of one embodiment of a process kit interfaced with a target and adapter of FIG. 1.

Referring to FIG. 3, in one embodiment, the isolator ring 180 is L-shaped. The isolator ring 180 comprises an annular band that extends about and surrounds the sputtering surface 133 of the target 132. The isolator ring 180 electrically isolates and separates the target 132 from the shield 160 and is typically formed from a dielectric or insulative material such as aluminum oxide. The isolator ring 180 comprises a lower horizontal portion 232 and a vertical portion 234 extending upward from the lower horizontal portion 232. The lower horizontal portion 232 comprises an inner periphery 235, an outer periphery 236, a bottom contact surface 237, and top surface 238, wherein the bottom contact surface 237 of the lower horizontal portion 232 contacts an upper contact surface 219 of the mounting flange 216. In one embodiment the upper contact surface 219 of the shield 160 forms a step 233. The step 233 provides a labyrinth gap that prevents conductive material from creating a surface bridge between the isolator ring 180 and the shield 160, thus maintaining electrical discontinuity. The upper vertical portion 234 of the isolator ring 180 comprises an inner periphery 239, an outer periphery 240, and a top surface 241. The inner periphery 239 of the upper vertical portion 234 and the inner periphery 235 of the lower horizontal portion 232 form a unitary surface. The top surface 238 of the lower horizontal portion 232 and the outer periphery 240 of the upper vertical portion 234 intersect at a transition point 242 to form a step 243. In one embodiment, the step 243 forms a labyrinth gap with the ring seal 136 and target 132.

In one embodiment, the isolator ring 180 has an inner diameter, defined by inner periphery 235 and inner periphery 239, between about 17.5 inches (44.5 cm) and about 18 inches (45.7 cm). In another embodiment, the isolator ring 180 has an inner diameter between about 17.5 inches (44.5 cm) and 17.7 inches (45 cm). In one embodiment, the isolator ring 180 has an outer diameter, defined by the outer periphery 236 of the lower horizontal portion 232, between about 18 inches (45.7 cm) and about 19 inches (48.3 cm). In another embodiment, the isolator ring 180 has an outer diameter between about 18.7 inches (47.5 cm) and about 19 inches (48.3 cm). In another embodiment, the isolator ring 180 has a second outer diameter, defined by the outer periphery 240 of the upper vertical portion 234, between about 18 inches (45.7 cm) and about 18.5 inches (47 cm). In another embodiment, the second outer diameter is between about 18.2 inches (46.2 cm) and about 18.4 inches (46.7 cm). In one embodiment, the isolator ring 180 has a height between about 1 inch (2.5 cm) and about 1.5 inches (3.8 cm). In another embodiment, the isolator ring 180 has a height between about 1.4 inches (3.6 cm) and about 1.45 inches (3.7 cm).

In one embodiment, the exposed surfaces, including the top surface 241 and inner periphery of the vertical portion 234, the inner periphery 235 and bottom contact surface 237 of the lower horizontal portion 232 of the isolator ring 180 are textured using for example, grit blasting, with a surface roughness of 180±20 Ra, which provides a suitable texture for low deposition and lower stress films.

Figure 2:
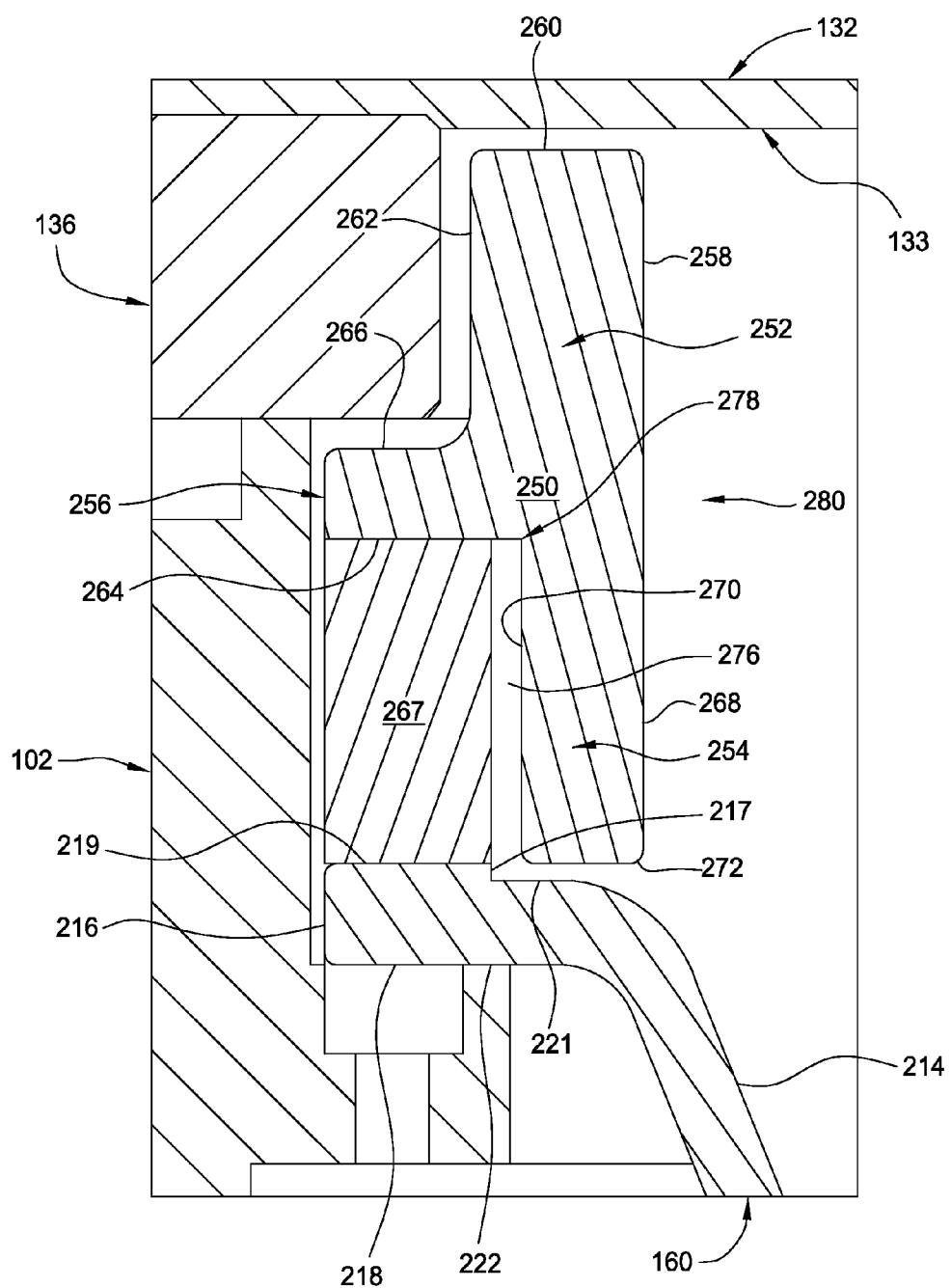
FIG. 2 is a partial sectional view of one embodiment of a process kit interfaced with a target and adapter of FIG. 1.

With reference to FIG. 2, in another embodiment, the isolator ring 280 is T-shaped. The isolator ring 280 comprises an annular band 250 that extends about and surrounds the sputtering surface 133 of the target 132. The annular band 250 of the isolator ring 280 comprises a top wall 252 having a first width, a bottom wall 254 having a second width, and a support rim 256, having a third width, extending radially outward from the top wall 252 of the annular band 250. In one embodiment, the first width is less than the third width but greater than the second width.

The top wall 252 comprises an inner periphery 258, a top surface 260 positioned adjacent to the target 132, and an outer periphery 262 positioned adjacent to the ring seal 136. The support rim 256 comprises a bottom contact surface 264 and an upper surface 266. The bottom contact surface 264 of the support rim 256 rests on an aluminum ring 267. In certain embodiments, the aluminum ring 267 is not present and the adapter 220 is configured to support the support rim 256. The bottom wall 254 comprises an inner periphery 268, an outer periphery 270, and a bottom surface 272. In one embodiment, the outer periphery 270 has an outer diameter of between about 18.5 inches (47 cm) and about 19 inches (48.3 cm). In another embodiment, the outer periphery 270 has an outer diameter of between about 18.8 inches (47.8 cm) and about 18.9 inches (48 cm). The inner periphery 268 of the bottom wall 254 and the inner periphery 258 of the top wall 252 form a unitary surface. In one embodiment, the isolator ring 280 has an inner diameter, defined by the inner periphery 268 of the bottom wall 254 and the inner periphery 258 of the top wall 252, between about 17 inches (43.2 cm) and about 18 inches (45.7 cm). In another embodiment, the inner diameter of the isolator ring 280 is between about 17.5 inches (44.5 cm) and about 17.8 inches (45.2 cm).

A vertical trench 276 is formed at a transition point 278 between the outer periphery 270 of the bottom wall 254 and the bottom contact surface 264 of the support rim 256. An inner periphery 217 of the upper contact surface 219 forms a step 221. The step 221, in combination with the vertical trench 276, provides a labyrinth gap that prevents conductive material from creating a surface bridge between the isolator ring 280 and the shield 160, thus maintaining electrical discontinuity while still providing shielding to the sidewall adapter 104. In one embodiment, the isolator ring 280 provides a gap between the target 132 and the ground components of the process kit 150 while still providing shielding to the chamber walls. In one embodiment, the gap between the target 132 and the shield 160 is between about 1 inch (2.5 cm) and about 2 inches (5.1 cm), for example, about 1 inch (2.5 cm). In another embodiment, the gap between the target 132 and the shield 160 is between about 1.1 inches (2.8 cm) and about 1.2 inches (3 cm). In yet another embodiment the gap between the target 132 and the shield 160 is greater than 1 inch (2.5 cm). The stepped design of the isolator ring 280 allows for the shield 160 to be centered with respect to the adapter 220, which is also the mounting point for the mating shields and the alignment features for the target 132. The stepped design also eliminates line-of-site from the target 132 to the shield 160, eliminating stray plasma concerns in this area.

In one embodiment, the isolator ring 280 has a grit-blasted surface texture for enhanced film adherence with a surface roughness of 180±20 Ra, which provides a suitable texture for low deposition and lower stress films. In one embodiment, the isolator ring 280 has a surface texture provided through laser pulsing for enhanced film adherence with a surface roughness of >500 Ra for a higher deposition thickness and higher film stress. In one embodiment, the textured surfaces extend the lifetime of the isolator ring 280 when the processing chamber 100 is used to deposit metals, metal nitrides, metal oxides, and metal carbides. The isolator ring 280 is also removable from the chamber 100 providing the ability to recycle the part without impact on material porosity that would prevent reuse in a vacuum seal application. The support rim 256 allows for the isolator ring 280 to be centered with respect to the adapter 220 while eliminating the line-of-site from the target 132 to the ground shield 160 thus eliminating stray plasma concerns. In one embodiment the ring 267 comprises a series of alignment pins (not shown) that locate/align with a series of slots (not shown) in the shield 160.

Figure 7B:
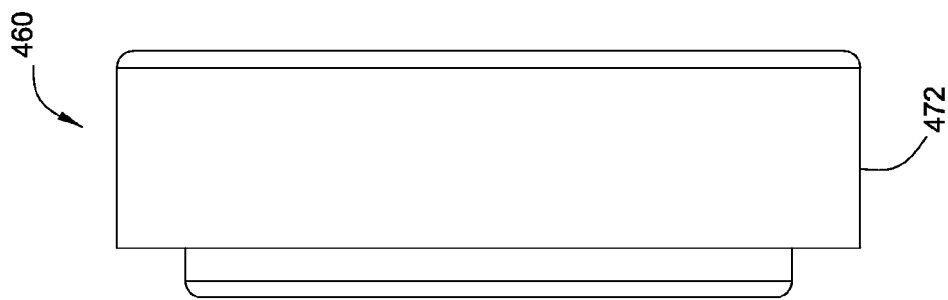
FIG. 7B is a side view of the cover ring shown in FIG. 7A.
Figure 7A:
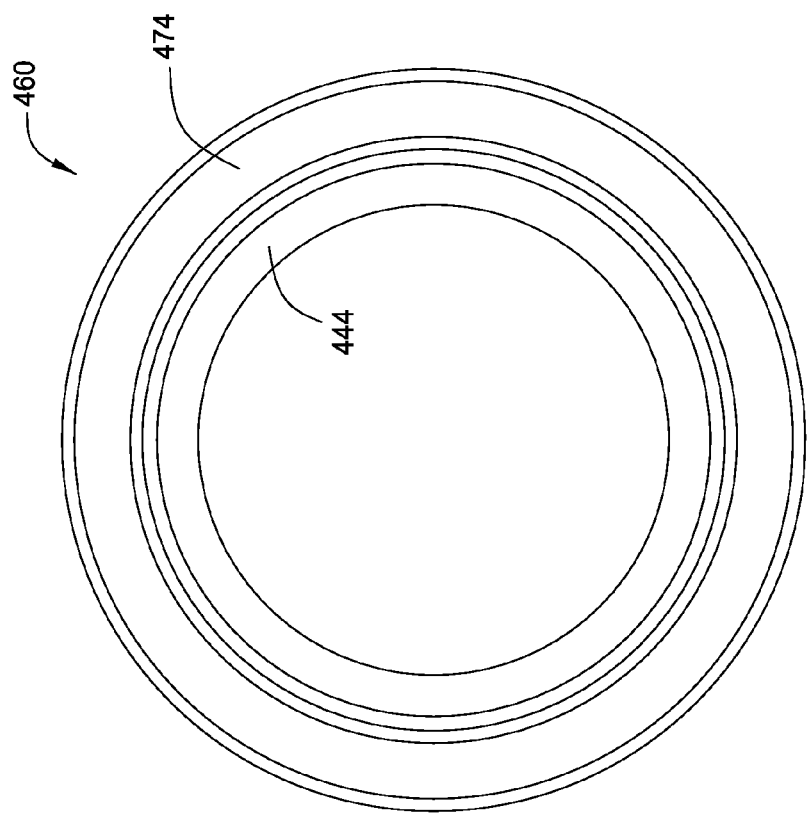
FIG. 7A is a top view of a cover ring shown in FIG. 4A.

FIG. 4A is one embodiment of a partial sectional view of a process kit 150 comprising a one piece shield 160, a deposition ring 410, a cover ring 460, and a centering mechanism 475. The process kit 150 may be interfaced with the processing system of FIG. 1. FIG. 7A is a top view of the cover ring 460 shown in FIG. 4A. FIG. 7B is a side view of the cover ring 460 shown in FIG. 7A. The deposition ring 410 rests on the pedestal assembly 120 while the cover ring 460 at least partially covers the deposition ring 410. The deposition ring 410 and the cover ring 460 cooperate with one another to reduce formation of sputter deposits on the peripheral edges 129 of the substrate support 126 and the overhanging edge of the substrate 105.

The cover ring 460 encircles and at least partially covers the deposition ring 410 to receive, and thus, shadow the deposition ring 410 from the bulk of the sputtering deposits. The cover ring 460 is fabricated from a material that can resist erosion by the sputtering plasma, for example, a metallic material such as stainless steel, titanium or aluminum, or a ceramic material, such as aluminum oxide. In one embodiment, the cover ring 460 is composed of titanium having a purity of at least about 99.9 percent. In one embodiment, a surface of the cover ring 460 is treated with a twin-wire aluminum arc-spray coating, such as, for example, CLEANCOAT™ protective coating, to reduce particle shedding from the surface of the cover ring 460.

The cover ring 460 comprises an annular wedge 462 comprising an inclined top surface 444 that is sloped radially inwards and encircles the substrate support 126. The inclined top surface 444 of the annular wedge 462 has an inner periphery 446 and an outer periphery 464. The inner periphery 446 comprises a projecting bulbous brim 461 which overlies a raised annular inner pad 428 of the deposition ring 410. The projecting brim 461 reduces deposition of sputtering deposits on the upper outer surface of the deposition ring 410. In one embodiment, the projecting brim 461 projects a distance corresponding to at least about half the width of the arc-shaped gap 402 formed with the deposition ring 410. The projecting brim 461 is sized, shaped, and positioned to cooperate with and complement the arc-shaped gap 402 to form a convoluted and constricted flow path between the cover ring 460 and deposition ring 410 that inhibits the flow of process deposits onto the pedestal assembly 120. The constricted flow path of the gap 402 restricts the build-up of low-energy sputter deposits on the mating surfaces of the deposition ring 410 and the cover ring 460, which would otherwise cause them to stick to one another or to the peripheral overhanging edge of the substrate 105. In one embodiment, the inclined top surface 444 is below the top of the deposition ring 410.

The inclined top surface 444 may be inclined at an angle of between about 10 degrees and about 20 degrees, for example, about 16 degrees from horizontal. The angle of the inclined top surface 444 of the cover ring 460 is designed to minimize the buildup of sputter deposits nearest to the overhanging edge of the substrate 105, which would otherwise negatively impact the particle performance obtained across the substrate 105.

The cover ring 460 comprises a footing 452 extending downward from the inclined top surface 444 of the annular wedge 462 to rest upon a ledge of the deposition ring 410. The footing 452 extends downwardly from the wedge 462 to press against the deposition ring 410 substantially without cracking or fracturing the ring 410. In one embodiment, a dual-stepped surface is formed between the footing 452 and the lower surface of the projecting brim 461.

The cover ring 460 further comprises an inner cylindrical band 470 and an outer cylindrical band 472. The inner cylindrical band 470 extends both downwardly and upwardly from the annular wedge 462, with the majority of the inner cylindrical band 470 disposed above the annular wedge 462. The upper portion of the inner cylindrical band 470 is coupled to the outer cylindrical band 472 by a bridge 474. The bridge 474 is disposed well above the wedge 462 and above the deposition ring 410. The outer cylindrical band 472 extends downward from the bridge 474 substantially parallel with the inner cylindrical band 470 to an end 476, forming a gap therebetween that allows the bands 470, 472 to interleave with the cylindrical inner band 226 of the shield 160. The end 476 terminates at an elevation above the bottom surface of the brim 461 and, in one embodiment, is aligned with the bottom surface of the inner flange of the deposition ring 410.

In one embodiment, the inner cylindrical band 470 and the outer cylindrical band 472 are substantially vertical. The inner and outer cylindrical bands 470 and 472 are located radially outward of the footing 452 of the annular wedge 462. The inner cylindrical band 470 extends below the end 476 of the outer cylindrical band 472. In one embodiment, the cover ring 460 has an outer diameter of about 15.6 inches and a height of about 2.5 inches. The cover ring may comprise a material that is compatible with process chemistries such as titanium or stainless steel.

In one embodiment, the cover ring 460 has an outer diameter, defined by the outer cylindrical band 472, between about 15.5 inches (39.4 cm) and about 16 inches (40.6 cm). In another embodiment, the cover ring 460 has an outer diameter between about 15.6 inches (39.6 cm) and about 15.8 inches (40.1 cm). In one embodiment, the cover ring 460 has a height between about 2 inch and about 3 inches.

The space or gap 404 between the shield 160 and the cover ring 460 forms a convoluted S-shaped pathway or labyrinth for plasma to travel. The shape of the pathway is advantageous, for example, because it hinders and impedes ingress of plasma species into this region, reducing undesirable deposition of sputtered material.

During certain processes it may be advantageous to position the substrate 105 closer to the target 132. The height of the cylindrical inner band 226 of the shield 160 and the height of the cover ring 460 allow the pedestal assembly 120 and cover ring 460 to be raised while maintaining the convoluted S-shaped pathway formed between the cover ring 460 and shield 160.

As shown in FIGS. 4A, 4B, 6A, and 6B, the centering mechanism 475 is positioned in one of the plurality of holes 290 of the cylindrical inner band 226 of the one piece shield 160. In one embodiment, the centering mechanism 475 comprises a ball 482 pressed into a cylindrical holder 484. The ball 482 provides a point contact 486 with an inner surface 478 of the inner cylindrical band 470 of the cover ring 460. The centering mechanism 475 works in conjunction with other centering mechanisms 475 positioned around the diameter of the cylindrical inner band 226 of the one piece shield 160 to maintain a controlled gap 488 between the cover ring 460 and the one piece shield 160. The centering mechanism 475 allows for the cover ring 460 to be centered relative to the one piece shield 160 allowing for an even gas conductance around the substrate 105 leading to an even gas distribution around the substrate. In previous designs, a cover ring was typically centered relative to the pedestal which allowed for a great deal of movement between the cover ring and the shield leading to an uneven gap between the cover ring and shield.

In one embodiment, the ball 482 has a diameter between about 0.05 inches (0.127 cm) and 0.2 inches (0.508 cm). In another embodiment, the ball 482 has a diameter between about 0.1 inches (0.254 cm) and about 0.13 inches (0.33 cm).

In one embodiment, the cylindrical holder 484 comprises a cylindrical wall 483 enclosing a hole 485 for holding the ball 482. The cylindrical wall 483 comprises an annular angled surface 487 angled outward related to the cylindrical wall 483 at an end 489 of the cylindrical holder 484. The cylindrical holder 484 may be press fit into the holes 290 of the shield 160. In another embodiment, the exterior of the cylindrical wall 483 has threads thereon. The cylindrical holder 484 may be passed through the hole 290 of the shield 160 and secured by a nut.

Figure 4C:
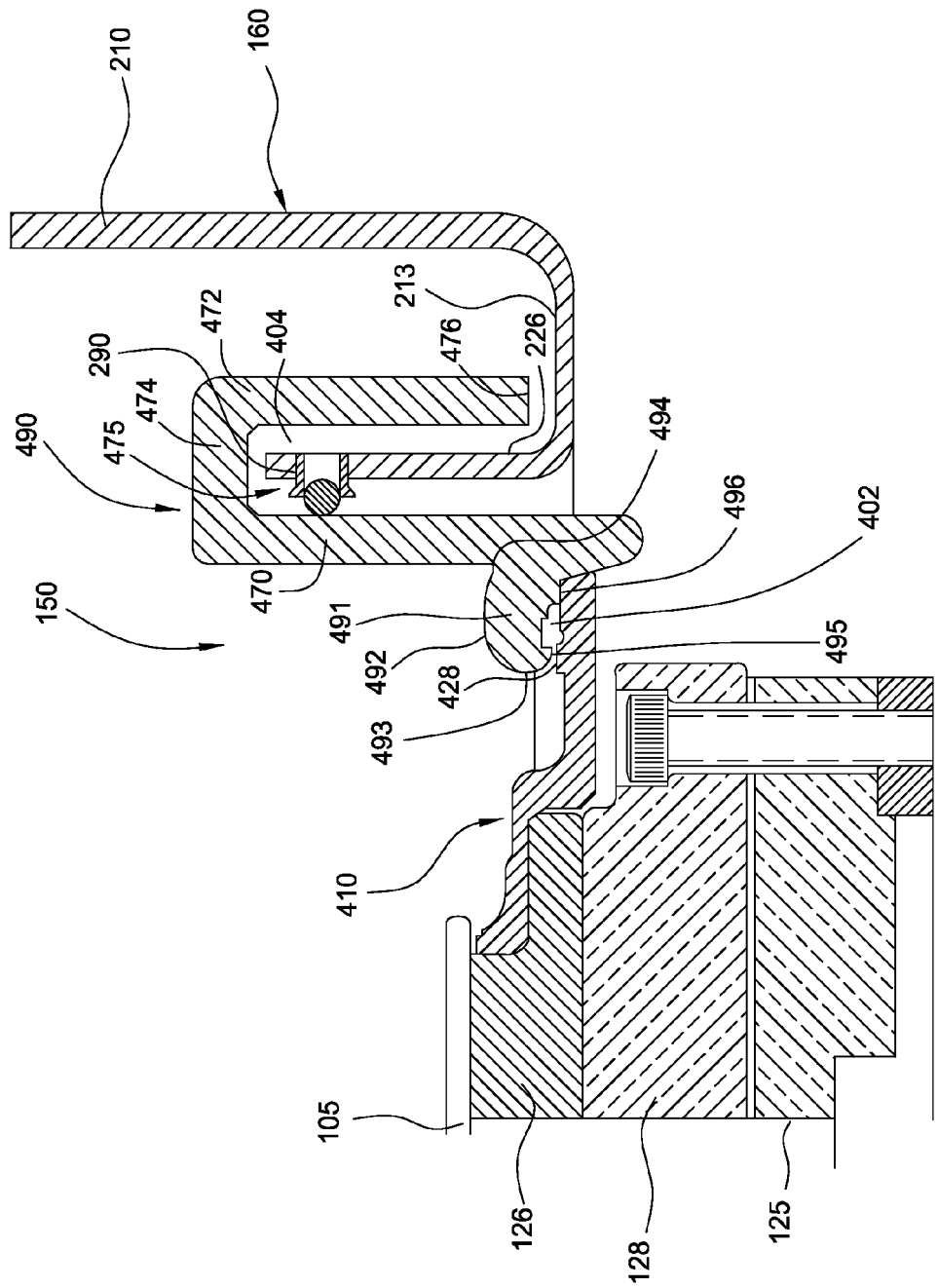
FIG. 4C is a partial sectional view of an alternative embodiment of a process kit interfaced with the processing system of FIG. 1.
Figure 5A:
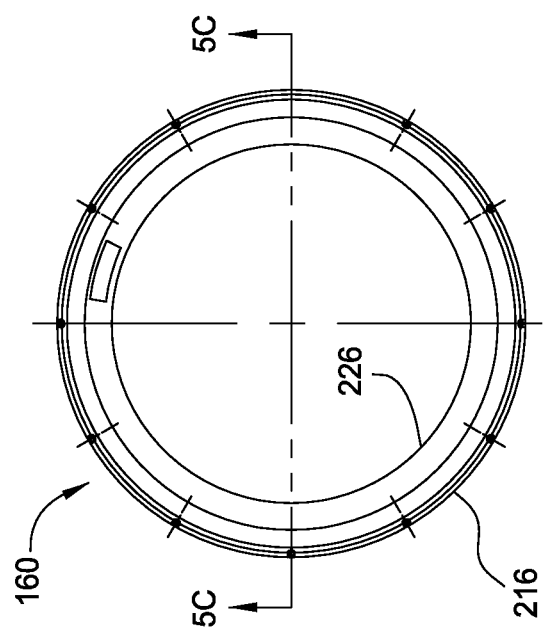
FIG. 5A is a top view of a one piece shield according to an embodiment described herein.
Figure 5B:
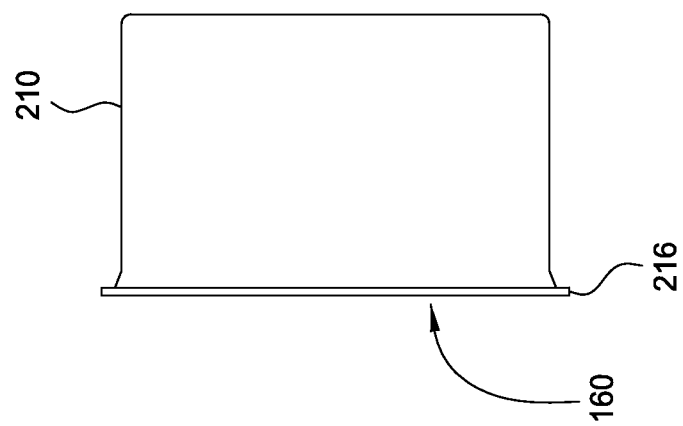
FIG. 5B is a side view of an embodiment of the one piece shield of FIG. 5A.
Figure 5C:
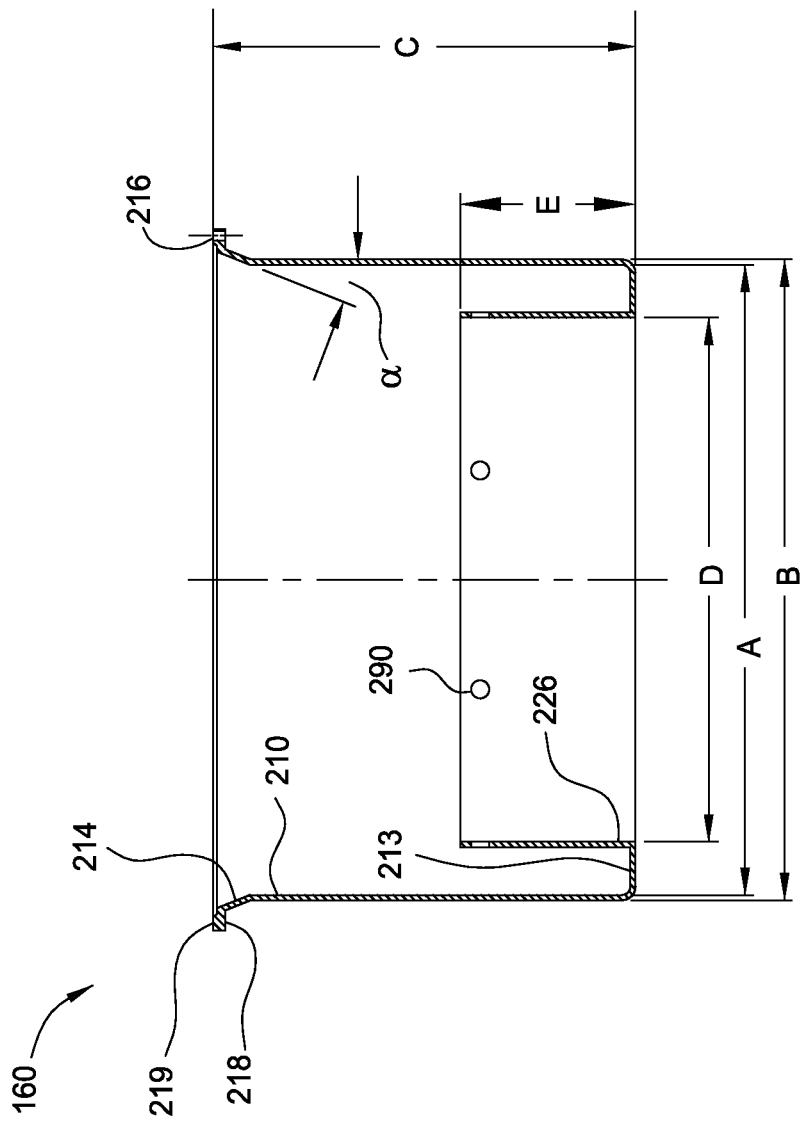
FIG. 5C is a cross-section view of one embodiment of the one piece shield of FIG. 5A.
Figure 5D:
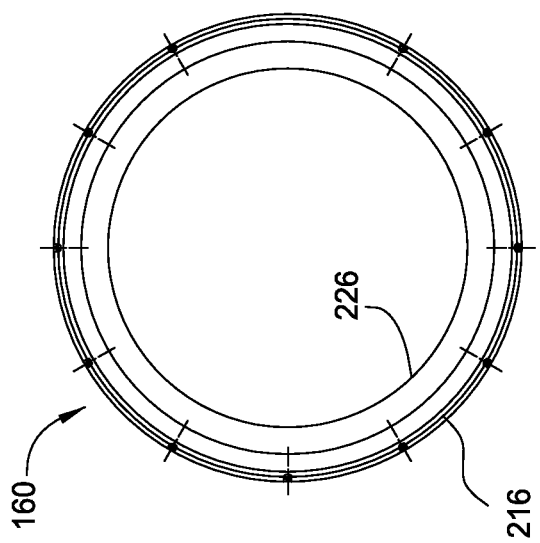
FIG. 5D is a bottom view of one embodiment of the one piece shield of FIG. 5A.
Figure 6B:
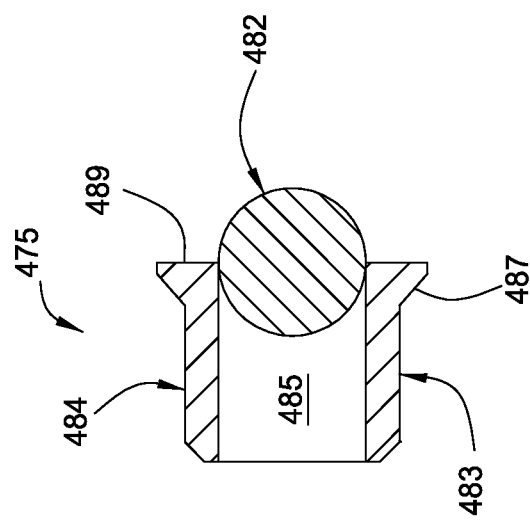
FIG. 6B is a cross-sectional view of the centering mechanism taken along line 6B-6B of FIG. 6A.
Figure 6A:
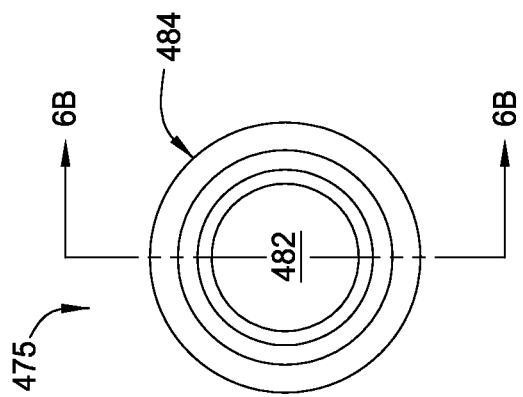
FIG. 6A is a bottom view of a centering mechanism according to one described herein.
Figure 8:
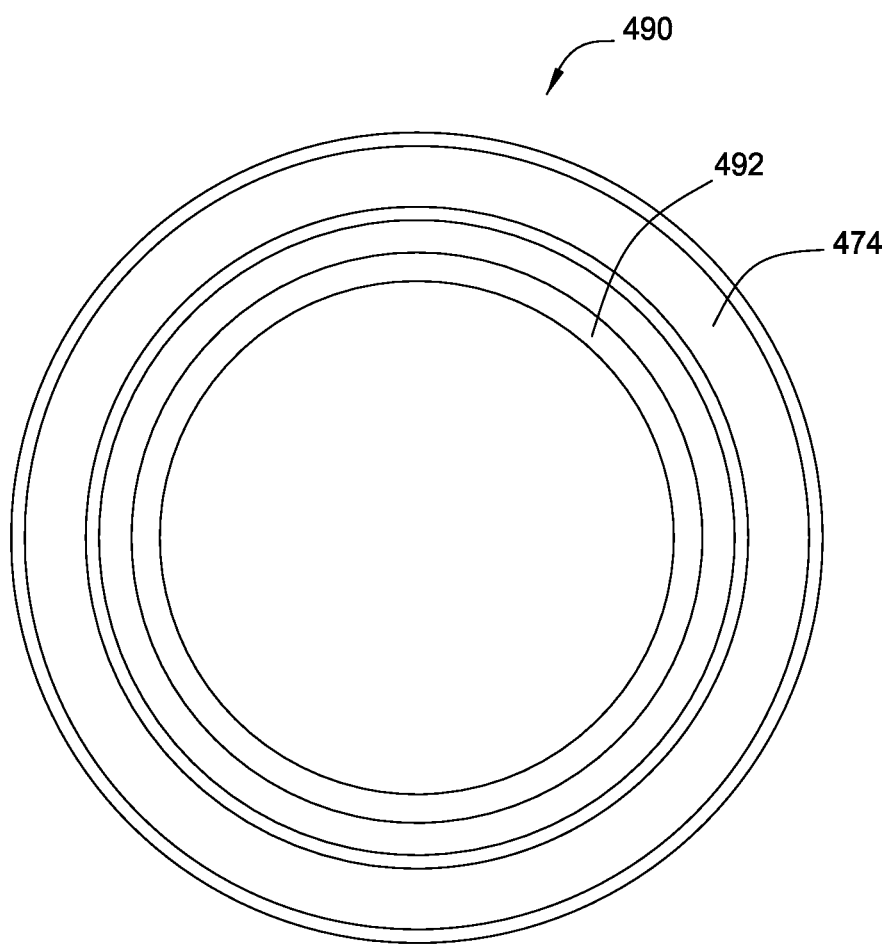
FIG. 8 is a top view of a cover ring shown in FIG. 4C.

FIG. 4C is another embodiment of a partial sectional view of a process kit comprising a one piece shield 160, a deposition ring 410, a cover ring 490, and a centering mechanism 475. The process kit 150 may be interfaced with the processing system of FIG. 1. FIG. 8 is a top view of the cover ring 490 shown in FIG. 4C. The process kit of FIG. 4C is similar to the process kit of FIG. 4A except for the cover ring 490. The deposition ring 410 rests on the pedestal assembly 120 while the cover ring 490 at least partially covers the deposition ring 410. The deposition ring 410 and the cover ring 490 cooperate with one another to reduce formation of sputter deposits on the peripheral edges 129 of the substrate support 126 and the overhanging edge of the substrate 105.

The cover ring 490 comprises an annular wedge 491 comprising a curved top surface 492 that encircles the substrate support 126. The curved top surface 492 of the annular wedge 491 has an inner periphery 493 and an outer periphery 494. The inner periphery 493 comprises a rounded brim 495 which overlies the raised annular inner pad 428 of the deposition ring 410. The rounded brim 495 reduces deposition of sputtering deposits on the upper outer surface of the deposition ring 410. In one embodiment, the rounded brim 495 projects a distance corresponding to at least about half the width of the arc-shaped gap 402 formed with the deposition ring 410. The rounded brim 495 is sized, shaped, and positioned to cooperate with and complement the arc-shaped gap 402 to form a convoluted and constricted flow path between the cover ring 490 and deposition ring 410 that inhibits the flow of process deposits onto the pedestal assembly 120. The constricted flow path of the gap 402 restricts the build-up of low-energy sputter deposits on the mating surfaces of the deposition ring 410 and the cover ring 490, which would otherwise cause them to stick to one another or to the peripheral overhanging edge of the substrate 105. In one embodiment, the curved top surface 492 is below the top of the deposition ring 410.

The cover ring 490 comprises a footing 496, similar to the cover ring 460, extending downward from the curved top surface 492 of the annular wedge 491 to rest upon a ledge of the deposition ring 410. The footing 496 extends downwardly from the wedge 491 to press against the deposition ring 410 substantially without cracking or fracturing the ring 410. In one embodiment, a dual-stepped surface is formed between the footing 496 and the lower surface of the rounded brim 495.

Similar to the cover ring 460 of FIG. 4A, the cover ring 490 further comprises an inner cylindrical band 470 and an outer cylindrical band 472. The inner cylindrical band 470 extends both downwardly and upwardly from the annular wedge 491, with the majority of the inner cylindrical band 470 disposed above the annular wedge 491. The upper portion of the inner cylindrical band 470 is coupled to the outer cylindrical band 472 by a bridge 474. The bridge 474 is disposed well above the wedge 491 and above the deposition ring 410. The outer cylindrical band 472 extends downward from the bridge 474 substantially parallel with the inner cylindrical band 470 to an end 476, forming a gap therebetween that allows the bands 470, 472 to interleave with the cylindrical inner band 226 of the shield 160. The end 476 terminates at an elevation above the bottom surface of the rounded brim 495 and, in one embodiment, is aligned with the bottom surface of the inner flange of the deposition ring 410.

In one embodiment, the inner cylindrical band 470 and the outer cylindrical band 472 are substantially vertical. The inner and outer cylindrical bands 470 and 472 are located radially outward of the footing 496 of the annular wedge 491. The inner cylindrical band 470 extends below the end 476 of the outer cylindrical band 472. The cover ring 490 may comprise a material that is compatible with process chemistries such as titanium or stainless steel.

In one embodiment, the cover ring 490 has an outer diameter, defined by the outer cylindrical band 472, between about 15.5 inches (39.4 cm) and about 16 inches (40.6 cm). In another embodiment, the cover ring 490 has an outer diameter between about 15.6 inches (39.6 cm) and about 15.8 inches (40.1 cm). In one embodiment, the cover ring 490 has an inner diameter between about 12 inches (30.5 cm) and about 13 inches (33 cm). In one embodiment, the cover ring 490 has a height between about 2 inch and about 3 inches.

The components of the process kit 150 described work alone and in combination to significantly improve the uniformity of as-deposited films.

While the foregoing is directed to embodiments of the present invention, other and further embodiments of the invention may be devised without departing from the basic scope thereof, and the scope thereof is determined by the claims that follow.

The invention claimed is:

1. A shield for encircling a sputtering target, comprising:
a base plate;
a cylindrical outer band having a first diameter, the cylindrical outer band vertically extending a first distance from the base plate to a top end;
a cylindrical inner band having a second diameter less than the first diameter, the cylindrical inner band vertically extending from the base plate a second distance less than the first distance; and
at least one centering mechanism disposed on an inner periphery of the cylindrical inner band and extending radially inward and perpendicular to the cylindrical inner band, wherein the centering mechanism comprises a ball disposed on the inner periphery of the cylindrical inner band.

2. The shield of claim 1, wherein the cylindrical outer band and the cylindrical inner band are substantially perpendicular to the base plate.

3. The shield of claim 1, wherein the first distance is between about 5 inches and about 7 inches.

4. The shield of claim 1, wherein the second distance is between about 1.5 inches to about 4 inches.

5. The shield of claim 1, wherein the first diameter is between about 16 inches and about 18 inches.

6. The shield of claim 1, wherein the second diameter is between about 14 inches and about 16 inches.

7. The shield of claim 1, wherein the base plate, cylindrical outer band, and cylindrical inner band comprise a unitary structure.

8. The shield of claim 7, wherein the unitary structure is made from aluminum or stainless steel.

9. The shield of claim 1, wherein six centering mechanisms are evenly distributed around the second diameter.

10. The shield of claim 9, wherein each of the centering mechanisms are positioned a uniform distance from a top of the cylindrical inner band.

11. The shield of claim 1, wherein a sloped step extends from a top portion of the cylindrical outer band radially beyond the first diameter.

12. The shield of claim 11, wherein a mounting flange extends radially outward from the sloped step.

13. A shield for a physical vapor deposition chamber, comprising:
a cylindrical outer band;
a cylindrical inner band;
a base plate coupling the cylindrical inner and outer bands for forming a single piece unitary member; and
a plurality of balls coupled to an inner periphery of the cylindrical inner band, wherein each ball of the plurality of balls is disposed within a centering mechanism, with each centering mechanism extending radially inward and perpendicular to the cylindrical inner band.

14. The shield of claim 13, wherein the balls comprise a sapphire material.

15. The shield of claim 14, further comprising:
a plurality of cylindrical holders, each holder having a respective one of the balls inserted therein, the cylindrical holders disposed in holes formed in the cylindrical inner band.

16. The shield of claim 15, wherein the holes are evenly spaced around the cylindrical inner band.

17. The shield of claim 16, wherein the holes are positioned a uniform distance from a top of the cylindrical inner band.

18. The shield of claim 13, wherein an upper portion of the cylindrical outer band is sized to surround a sputtering target and a bottom portion of the cylindrical outer band is sized to surround a substrate support.

19. The shield of claim 13, wherein the cylindrical outer band and the cylindrical inner band are substantially perpendicular to the base plate.

* * * * *